United States Patent [19]

Beale

[11] 4,444,991

[45] Apr. 24, 1984

[54] HIGH-EFFICIENCY THERMOPILE

[75] Inventor: Harry A. Beale, Columbus, Ohio

[73] Assignee: Omnimax Energy Corporation, Philadelphia, Pa.

[21] Appl. No.: 401,485

[22] Filed: Jul. 26, 1982

Related U.S. Application Data

[63] Continuation-in-part of Ser. No. 358,176, Mar. 15, 1982.

[51] Int. Cl.³ .......................................... H01L 35/28
[52] U.S. Cl. ..................................... 136/225; 29/573; 62/3; 136/201; 136/212; 204/192 R; 204/192 SP; 427/58
[58] Field of Search .............................. 62/3; 29/573; 204/192 R, 192 SP; 136/212, 224, 225, 201; 427/58

[56] References Cited

U.S. PATENT DOCUMENTS

| | | | |
|---|---|---|---|
| 2,519,785 | 8/1950 | Okolicsanyi | 136/212 |
| 3,125,860 | 3/1964 | Reich | 62/3 |
| 4,251,290 | 2/1981 | Gomez | 136/225 X |
| 4,257,822 | 3/1981 | Gomez | 136/225 X |
| 4,362,023 | 12/1982 | Falco | 62/3 |

FOREIGN PATENT DOCUMENTS

| | | | |
|---|---|---|---|
| 1059939 | 6/1959 | Fed. Rep. of Germany | 62/3 |
| 1280384 | 11/1961 | France | 136/224 |
| 1021486 | 3/1966 | United Kingdom | 136/212 |

*Primary Examiner*—Leland A. Sebastian
*Attorney, Agent, or Firm*—John L. Gray

[57] ABSTRACT

A thermopile formed of conductor elements of dissimilar materials, the junctions of the dissimilar materials being much larger in cross-section than the normal cross-sectional area of the conductor elements, and junctions in one temperature zone being much larger than the corresponding junctions in the other temperature zone. If the thermopile is used to generate electricity, the heated junctions will be much larger in cross-section than the normal cross-sectional area of the conductor elements and they will also be much larger in cross-section than the junctions in the cooler zone. If the thermopile is to be used as a cooling device rather than an electric generating device and electricity is applied to the thermopile, then the cold junctions will be much larger in cross-section than the warm junctions and the cold junction cross-sectional area will also be much larger than the cross-sectional area of conductor elements of the thermopile. In a variation of the thermopile the conductor elements are made of materials which are dissimilar to the larger cross-sectional area junctions and to each other. Also, the junctions having a smaller cross-sectional area may be made of materials dissimilar to the materials from which the conductor elements are made. A method of making such thermopiles utilizing thin-film technology is also shown.

15 Claims, 10 Drawing Figures

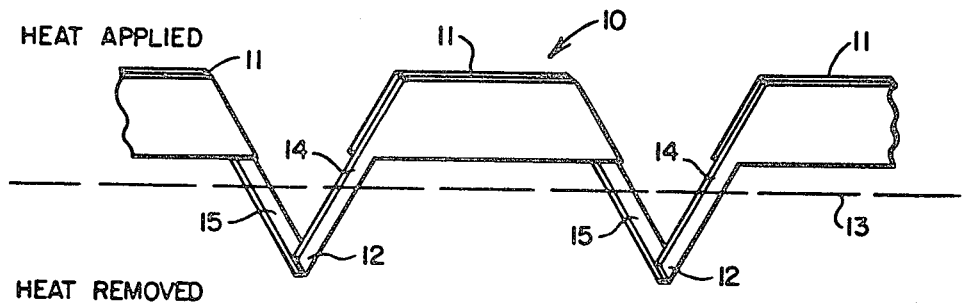
FIG. 1
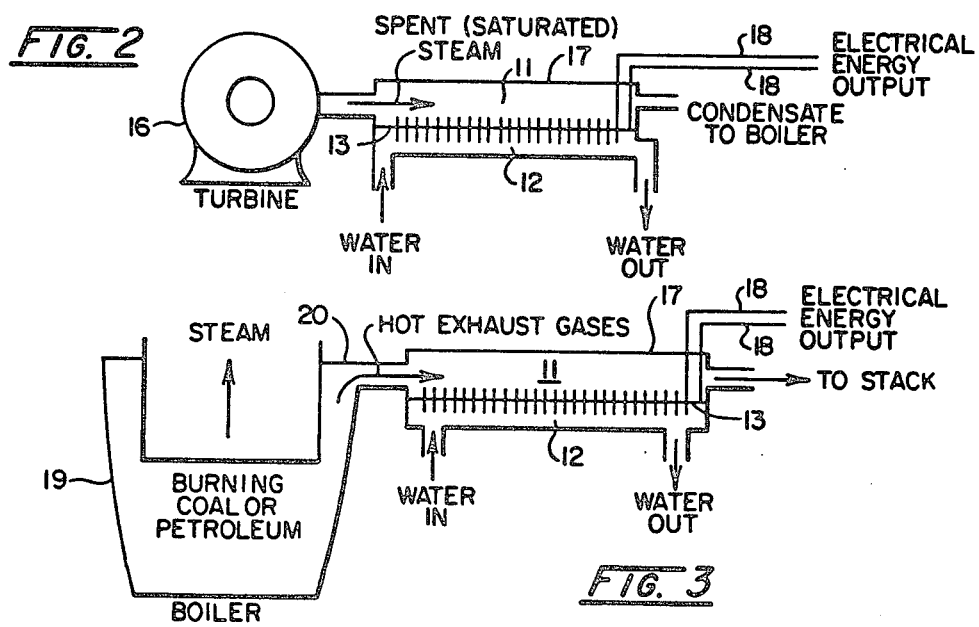
FIG. 2
FIG. 3
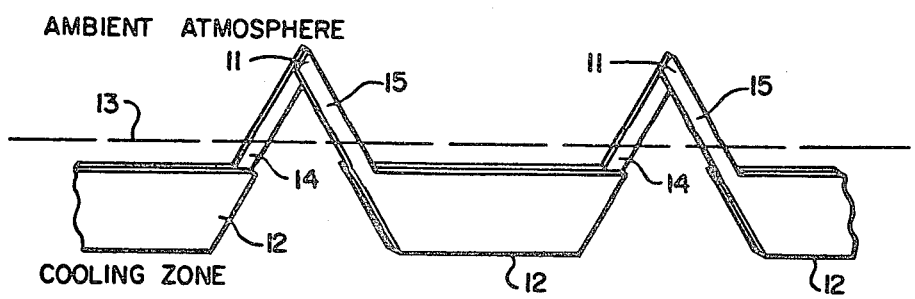
FIG. 4

HIGH-EFFICIENCY THERMOPILE

INTRODUCTION

This is a continuation-in-part of U.S. Patent Application Ser. No. 06/358,176 filed Mar. 15, 1982.

BACKGROUND OF THE INVENTION

Ordinarily thermocouples are formed of two dissimilar materials joined at a junction with the open legs of the thermocouple connected to an electrical loan and at a lower temperature than the junction where the two dissimilar materials are joined. The temperature differential produces a flow of electrons and this flow can be measured. Common use of the thermocouple is to measure temperature.

Thermopiles are usually made of thermocouples connected in series with the strings of series connected thermocouples connected in parallel in order to maximize current and voltage output.

When thermocouple conductor elements are connected together in series to form a thermopile, one group of junctions will be in a cold zone where heat is removed, and the other group of junctions will be in a heated area. The electrons which carry the current and the heat energy, surrender the heat at the lower temperature junction. The Peltier effect is produced at each junction but in the opposite direction at each. Because there is a temperature difference between the reservoirs in contact with the legs of the thermocouples, the temperature gradient is produced along their length. This temperature gradient also leads to the production of an electric current and this process is called the Thomson effect.

In practice, hundreds or thousands of thermocouples can be connected in series to produce sizable voltages.

Additional banks of thermocouples can then be connected in parallel with the net result that a source of a significant amount of current at high voltage is developed. This technique has been used to generate electricity in extremely small quantities.

Likewise, utilizing the reverse effect by introducing electricity into this system, and having the hot junction in the ambient air and the cold junction in a contained zone to be cooled, the Peltier effect can be utilized to produce refrigerating device, again of low efficiency, however.

Recently it has been recognized that if the cross-sectional area of the junction is larger than the cross-sectional area of the thermocouple legs, certain improvements in the efficiency of the device can be obtained. U.S. Pat. No. 4,251,290, Gomez, U.S. Pat. No. 4,251,291, Gomez, and U.S. Pat. No. 4,257,822, Gomez, all disclose this feature. This disclosure is based on the improvement in efficiencies based on the fact that there is a minimum of heat transfer across the junction since the legs of the thermopile are relatively thin in their cross-sectional area compared with the junction and thus heat flow is minimized and the temperature difference between the thermoelectric junctions is maximized and thus the voltage developed therebetween is increased. Unfortunately, there is no indication in the Gomez disclosures of the degree of improvement obtained.

SUMMARY OF THE INVENTION

This invention relates to a novel thermopile with markedly improved efficiency over conventional thermopiles. This is accomplished by providing a thermopile formed from thermocouples each formed of two conductors wherein the cross-sectional area of the junction is considerably larger than the cross-sectional area of the legs of the thermocouple and the cross-sectional area of junctions in one zone are disproportionately larger than the cross-sectional area of junctions in the other zone. In fact, the cross-sectional area of the smaller junction can be the same cross-sectional area as that of the legs or smaller, if desired. If the thermopile is to be used to generate electrical energy, the junctions in the heated zone will be considerably larger in cross-section than the junctions in the zone from which heat is to be removed.

If the invention is to be used in the reverse fashion as a cooling device, the cross-sectional area of the junctions in the cooling zone could be much larger than the cross-sectional area of the junctions in the ambient atmosphere zone when electrical energy is applied to the thermopile, as well as being much larger in cross-sectional area than the legs of the thermocouples forming the thermopile.

Another embodiment of the invention which optimizes the Thomson effect involves the choice of materials for the legs which are dissimilar to the junctions having the larger cross-sectional area and to each other. The junctions having the smaller cross-sectional area may also be made of dissimilar materials if desired.

It is an object of this invention therefore to provide an improved thermopile by utilizing thin-film technology so as to provide a significant improvement in efficiency of the production of electrical energy.

It is a further object of this invention to provide a thermopile which may be used as a refrigerating device with an input of electrical energy with a resultant significantly improved efficiency.

It is a still further object of this invention to manufacture such devices cheaply and efficiently by thin-film processes suitable to mass production.

This, together with other objects and advantages of the invention, should become apparent in the details of construction and operation as more fully described hereinafter and claimed, reference being had to the accompanying drawings forming a part hereof wherein like numerals refer to like parts throughout.

BRIEF DESCRIPTION OF THE DRAWINGS

FIG. 1 is a perspective view of one embodiment of the thermopile.

FIG. 2 is a schematic view showing the application of a thermopile formed in this fashion to generate electricity utilizing saturated spent steam from a turbine to apply heat and cooling water to remove the heat applied.

FIG. 3 is a similar use of a thermopile formed in accordance with FIG. 1 wherein the hot exhaust gases from the primary combustion process in an electric generating system are utilized to heat the hot junctions of the thermopile.

FIG. 4 is a perspective view of the thermopile constructed in accordance with this invention in which the thermopile is used as a cooling device rather than generating electricity and electricity is applied to it.

DETAILED DESCRIPTION OF THE INVENTION

Figure 5:
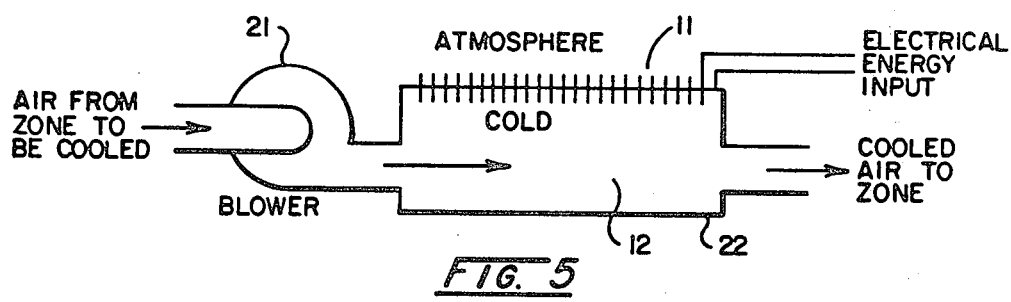
FIG. 5 shows the use of the thermopile formed in accordance with FIG. 4 in an air conditioning system.

Referring now to the drawings and more particularly to FIG. 1, a thermopile is shown generally at 10 with the upper hot junctions 11-11 being separated from the lower cold junctions 12-12 by an insulating medium indicated by the dotted line 13. It will be noted that the cross-sectional area of junctions 11-11 is not only much greater than the cross-sectional area of the junctions 12-12 but is also much greater than the cross-sectional area of either legs 14-14 or legs 15-15, which are made of dissimilar materials. The upper junctions 11-11 shown in FIG. 1 of the thermopile 10 have heat applied thereto while the lower smaller junctions 12-12 of the thermopile 10 have heat removed therefrom. Because the cross-sectional area of junctions 11-11 is both greater than the cross-sectional area of legs 14-14 and legs 15-15 and also the cold junctions 12-12, the thermopile operates at much greater efficiency and generates more electric energy.

Referring now more particularly to FIG. 2, illustrated schematically is the exhaust from a turbine 16 connected to a heat exchanger 17 separated throughout its length by an insulating area 13. A thermopile is positioned within the heat exchanger 17 provided with a multiplicity of junctions 11-11 in the heating zone and junctions 12-12 in the cooling zone, the output of the thermopile being connected by lines 18-18 to a suitable electrical load. The junctions 11-11 and 12-12 are connected in series and strings of the series connected units are connected in parallel.

The spent saturated steam from the turbine 16 which could be used to generate electricity, as in a public utility, enters the heated zone of the heat exchanger 17 causing the hot junctions 11-11 of the thermopile to be heated, while cooling water is introduced into the opposite insulated zone of the heat exchanger 17 whereby the cold junctions 12-12 of the thermopile are kept cool and thus a temperature differential is produced.

Likewise in FIG. 3, schematically represented, is a boiler 19 and an exhaust stack 20 which permits the hot exhaust gases to go through a heat exchanger 17 coming in contact with the hot junctions 11-11 of the thermopile which are insulated by a suitable insulating medium 13 from the cold junctions 12-12 of the thermopile. Again, electrical energy produced is connected to a suitable load and the cooling water maintains the cool junctions 12-12 at a much lower temperature than the hot exhaust gases 19, the hot junctions 11-11, thus producing electrical energy output.

Referring now more particularly to FIG. 4, there is shown a thermopile which is used as a cooling device. The hot junctions 11-11 in this instance are smaller in cross-section than the cross-section of the cold junctions 12-12 and, of course, the legs 14-14 and legs 15-15 are also smaller in the cross-sectional area. The cold junctions 12-12 of this thermopile are placed in the cooling zone and hot junctions 11-11 of this thermopile are placed in the ambient atmosphere. In this instance, of course, rather than generating electricity, electrical energy is applied to the thermopile to produce cooling by means of the Peltier effect.

Referring now more particularly to FIG. 5, the use of such a cooling device described in FIG. 4 is shown schematically with a blower 21 which takes air from the zone to be cooled, blows it through a heat exchanger 22, wherein the cold junctions 12-12 are contained and insulated from the hot junctions 11-11 which are in the atmosphere. The air flowing over the cold junctions 12-12 is thus cooled and sent to the zone to be cooled.

Figure 6A:
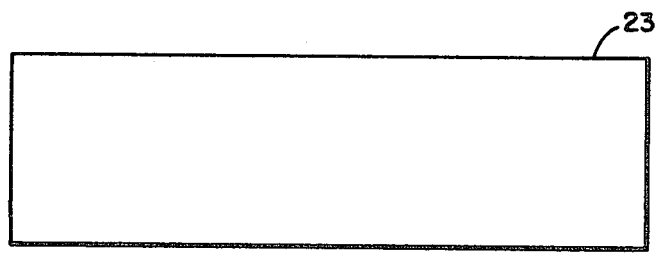
FIGS. 6A, 6B, and 6C disclose a method of making a thermopile in accordance with this invention.
Figure 6B:
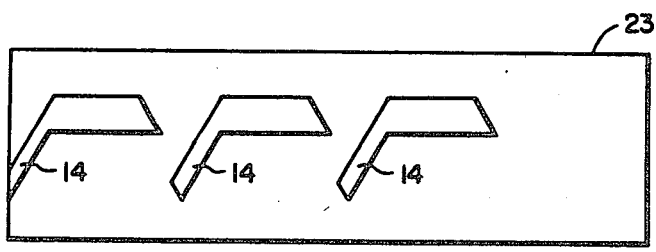
Figure 6C:
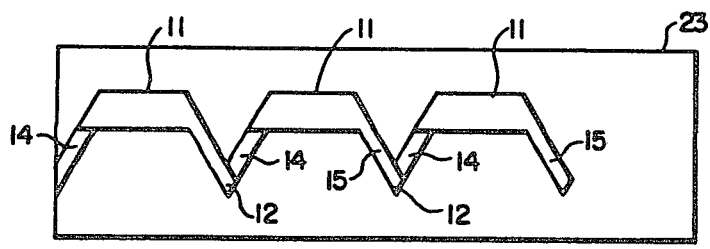

Referring now more particularly to FIGS. 6A, 6B, and 6C, a method for producing such a thermopile is disclosed.

FIG. 6A shows a nonconducting substrate 23. In FIG. 6B, an appropriate metal is deposited on the substrate 23 using a mask to limit the location of the areas where the metal is to be deposited.

The metal may be deposited by sputtering, by evaporation, or by any other suitable means. Sputtering is the preferred process.

The mask may be made of any suitable material, oxidized metal being preferred to facilitate removal of excess coating material.

In FIG. 6C, a dissimilar metal is shown to be deposited over a portion of the metal deposited in FIG. 6B, again using a suitable mask to achieve this result. Because of the thin-film technique which is employed, the relative difference in the cross-sectional area between the legs 14-14 and legs 15-15 of the thermopile thus formed and the cross-sectional area of the junctions 11-11 and 12-12 can be dramatically different, by factors as great as one thousand or more, thus enabling the upper junctions 11-11 in this instance to be much broader and much greater in cross-sectional area than both the legs 14-14 and 15-15 as well as the lower junctions 12-12.

Figure 7:
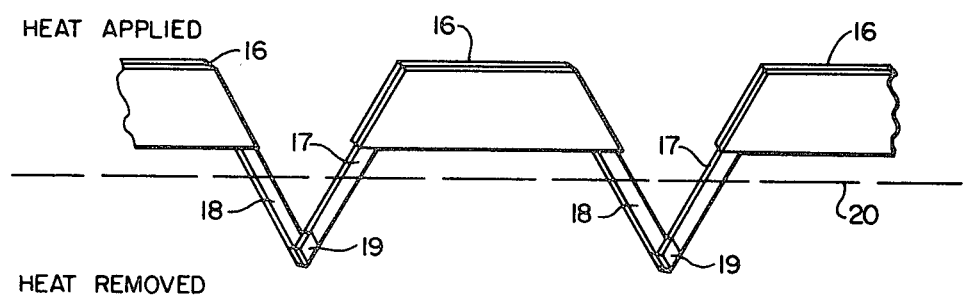
FIG. 7 is a perspective view similar to that shown in FIG. 1 wherein the materials constituting the legs of the thermopile are dissimilar to the junction materials chosen so as to maximize the Thomson effect.

Referring now more particularly to FIG. 7, there is shown another embodiment of the invention further to enhance the efficiency of the thermopile. In this instance the upper junctions 16-16 in FIG. 7 are much broader and much greater in cross-section than both the legs 17-17 and the legs 18-18 as well as the lower junctions 19-19. As indicated in the drawing, the legs 17-17 may be made from different materials than the materials comprising the junctions 16-16. This is especially convenient to fabricate utilizing thin-film technology. Likewise, the legs 18-18 may be made of different materials than the materials making up the junctions 16-16 and the legs 18-18 should be made from different materials than the legs 17-17 in order to enhance the efficiency by improving the Thomson effect. Likewise, the junctions 19-19 may also be made of different materials than the legs 17-17 and 18-18.

The upper hot junctions 16-16 are separated from the lower cold junctions 19-19 by an insulating medium indicated by the dotted line 20.

Figure 8:
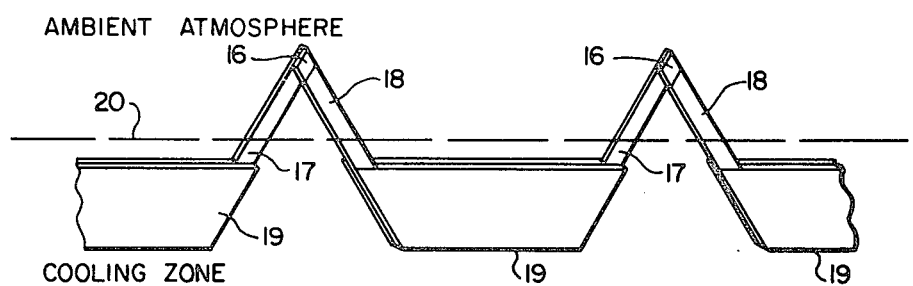
FIG. 8 is a perspective view of the thermopile constructed in accordance with this invention similar to that shown in FIG. 4 wherein the material constituting the legs of the thermopile are different from the junctions having the larger cross-sectional area and also from each other so as to maximize the Thomson effect.

Referring now more particularly to FIG. 8, there is shown the same thermopile shown in FIG. 7. The hot junctions 16-16 are smaller in cross-section than the cross-section of the cold junctions 19-19 and the legs 17-17 and the legs 18-18 are smaller in cross-section than the cross-section of the cold junctions 19-19. The cold junctions 19-19 are placed in a cooling zone and the hot junctions 16-16 are placed in the ambient atmosphere. In this instance, of course, rather than generating electricity, electrical energy is applied to the thermopile to produce cooling by means of the Peltier effect. The efficiency of the device is further enhanced by making the legs 17-17 and legs 18-18 different from the materials constituting the junctions 19-19 and different from each other so as to enhance the Thomson effect. Likewise, the junctions 16-16 may be made of different materials than either the legs 17-17 or the legs 18-18. For certain thermal conditions, it may be more appropriate to have both junctions much larger than the legs.

Thus, it will be seen that a thermopile which may be used either for generating electricity or for cooling purposes utilizing the Peltier effect and having much greater efficiency than those disclosed in the prior art has been disclosed.

In addition, a variation of this thermopile, which may be used either for generating electricity or for cooling, which provides for an enhancement of the Thomson effect, is also disclosed.

Also disclosed has been a simplified method of manufacturing such a thermopile economically and in large quantities.

While this invention has been illustrated with only a few thermocouples arranged in a thermopile, it must be recognized that in use, thousands of such thermocouples are connected together to form thermopiles in series and the series strands are connected in parallel to produce significant current values at relatively high voltages.

While this invention has been described in its preferred embodiment, it is appreciated that variations thereon may be made without departing from the proper scope and spirit of the invention.

What is claimed is:

1. A thermopile comprising a plurality of first legs and second legs, said legs being connected in series with said first and second legs alternating; the connection between adjacent legs constituting junctions; the cross-sectional area of every other junction being considerably larger than the cross-sectional area of the remaining junctions and the cross-sectional area of any of said legs.

2. The thermopile of claim 1 wherein said larger junctions are separated from said remaining junctions by a thermal insulating layer.

3. The thermopile of claim 2 wherein every other junction is positioned in a separate zone, the zone in which said larger junctions are positioned having a higher temperature than the zone in which said remaining junctions are positioned.

4. The thermopile of claim 3 wherein the unconnected end of said first leg and the unconnected end of said second leg are connected to an electrical load.

5. The thermopile of claim 4 wherein the higher temperature of said zone in which said larger junctions are positioned is provided by waste heat from a suitable source and the temperature of said zone in which said remaining junctions are positioned is supplied by a coolant.

6. The thermopile of claim 2 wherein said remaining junctions are positioned in the ambient atmosphere.

7. The thermopile of claim 6 wherein the larger junctions are located in an enclosed zone which is to be cooled.

8. The thermopile of claim 7 wherein the unconnected end of said first leg and the unconnected end of said second leg are connected to a source of electricity.

9. The thermopile of claim 1 wherein the cross-sectional area of said remaining junctions are approximately the same as the cross-sectional area of the leg having the smallest cross-sectional area to which they are connected.

10. The thermopile of claim 1 wherein the cross-sectional area of said remaining junctions are substantially smaller than the cross-sectional area of the leg having the smallest cross-sectional area to which they are connected.

11. The thermopile of claim 1 wherein said first leg is made from a material dissimilar to the material in said first junction and also dissimilar to the material constituting said second leg, and the third leg is made of a material dissimilar to the material in said second leg.

12. The thermopile of claim 11 wherein said first leg and said third leg are made from the same material.

13. The thermopile of claim 11 wherein said second junction is made from a material dissimilar to the material constituting said first leg and the material constituting said second leg.

14. A method of making a thermopile which comprises placing a first mask over a nonconducting substrate which first mask will permit the deposition of a first material on said substrate which will constitute part of an element of a thermopile comprising at least one leg of a thermocouple, depositing said first material on said substrate, removing said first mask, and placing a second mask over said nonconducting substrate and said previously deposited first material which second mask will permit the deposition of a second material which is dissimilar to said first material on said substrate which will constitute a first one-half of a junction of a thermocouple attached to said leg, depositing said material, removing said second mask and placing a third mask over said nonconducting substrate and said at least one leg of a thermocouple, said third mask permitting the deposition of a third material which is dissimilar to said second material on said first one-half of said junction which will constitute part of an element of a thermopile and comprise the second half of said junction, depositing said third material, removing said third mask and placing a fourth mask over said one leg, said junction, and said substrate which will permit the deposition of a fourth material dissimilar to said junction materials and said one leg made from said first material and which will constitute a second leg of a thermopile attached to said juction, depositing said fourth material, removing said fourth mask, whereby said deposited fourth material will constitute part of an element of a thermopile and at least the other leg of said thermocouple so as to provide a thermopile wherein the cross-sectional area of the junction thus formed may be disproportionate to the cross-sectional area of the thermocouple legs in the thermopile and whereby the two legs of the thermocouple and the junction of the thermocouple may be all made from dissimilar materials.

15. A method of making a thermopile which comprises placing a first mask over a nonconducting substrate which first mask will permit the deposition of a material on said substrate which will constitute one-half of a thermopile comprising a plurality of thermocouple legs and at one end of each of said legs one-half of a first junction and at the other end of each of said legs one-half of a second junction of a thermocouple, depositing a material on said substrate, removing said first mask and placing a second mask over said nonconducting substrate which second mask will permit deposition of a dissimilar material on said substrate which will constitute the remaining part of said thermopile and the other legs of said thermopile having at one end of each of said legs the other half of the first junction of said thermocouple and at the other end of each of said legs the other half of the second junction of said thermocouple, depositing a dissimilar material on said substrate and on said first and second junctions so as to provide a thermopile wherein the cross sectional area of the first junctions thus formed will be considerably larger than the cross sectional area of the second junctions thus formed and any of said legs thus formed.

* * * * *